United States Patent
Wada et al.

(10) Patent No.: US 8,809,945 B2
(45) Date of Patent: Aug. 19, 2014

(54) SEMICONDUCTOR DEVICE HAVING ANGLED TRENCH WALLS

(71) Applicant: Sumitomo Electric Industries, Ltd., Osaka (JP)

(72) Inventors: Keiji Wada, Osaka (JP); Takeyoshi Masuda, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/679,543

(22) Filed: Nov. 16, 2012

(65) Prior Publication Data

US 2013/0134442 A1 May 30, 2013

Related U.S. Application Data

(60) Provisional application No. 61/563,715, filed on Nov. 25, 2011.

(30) Foreign Application Priority Data

Nov. 24, 2011 (JP) ................................. 2011-255732

(51) Int. Cl.

| H01L 29/76 | (2006.01) |
|---|---|
| H01L 29/94 | (2006.01) |
| H01L 31/062 | (2012.01) |
| H01L 31/113 | (2006.01) |
| H01L 31/119 | (2006.01) |
| H01L 29/24 | (2006.01) |
| H01L 29/66 | (2006.01) |
| H01L 29/78 | (2006.01) |
| H01L 29/423 | (2006.01) |
| H01L 29/04 | (2006.01) |
| H01L 29/16 | (2006.01) |

(52) U.S. Cl.
CPC ............... *H01L 29/24* (2013.01); *H01L 29/045* (2013.01); *H01L 29/66666* (2013.01); *H01L 29/1608* (2013.01); *H01L 29/7813* (2013.01); *H01L 29/4236* (2013.01); *H01L 29/66068* (2013.01)
USPC ........... 257/330; 257/332; 257/328; 257/329; 257/E29.201

(58) Field of Classification Search
CPC ............ H01L 29/7802; H01L 29/7813; H01L 29/7825; H01L 29/7827; H01L 29/78642
USPC .................. 257/330, 332, 328, 329, E29.201
IPC ..................... H01L 29/7802, 29/7813, 29/7825, H01L 29/7827, 29/78642
See application file for complete search history.

(56) References Cited

U.S. PATENT DOCUMENTS

| 5,723,376 A | 3/1998 | Takeuchi et al. |
| 5,744,826 A | 4/1998 | Takeuchi et al. |

(Continued)

FOREIGN PATENT DOCUMENTS

| JP | 07-326755 A | 12/1995 |
| JP | 08-070124 A | 3/1996 |

(Continued)

*Primary Examiner* — Ida M Soward
(74) *Attorney, Agent, or Firm* — Venable LLP; Michael A. Sartori

(57) ABSTRACT

A MOSFET includes: a substrate provided with a trench having a side wall surface having an off angle of not less than 50° and not more than 65° relative to a {0001} plane; an oxide film; and a gate electrode. The substrate includes a source region, a body region, and a drift region formed to sandwich the body region between the source region and the drift region. The source region and the body region are formed by means of ion implantation. The body region has an internal region sandwiched between the source region and the drift region and having a thickness of 1 μm or smaller in a direction perpendicular to a main surface thereof. The body region has an impurity concentration of $3 \times 10^{17}$ cm$^{-3}$ or greater.

8 Claims, 5 Drawing Sheets

(56) References Cited

U.S. PATENT DOCUMENTS

| | | | |
|---|---|---|---|
| 5,915,180 A | 6/1999 | Hara et al. | |
| 5,976,936 A * | 11/1999 | Miyajima et al. | 438/268 |
| 6,057,558 A | 5/2000 | Yamamoto et al. | |
| 6,133,587 A | 10/2000 | Takeuchi et al. | |
| 6,573,157 B1 * | 6/2003 | Sato | 438/462 |
| 6,573,534 B1 * | 6/2003 | Kumar et al. | 257/77 |
| 7,615,849 B2 * | 11/2009 | Nakamura et al. | 257/628 |
| 7,829,940 B2 * | 11/2010 | Hirler et al. | 257/329 |
| 8,178,920 B2 * | 5/2012 | Nakamura et al. | 257/330 |
| 8,563,981 B2 * | 10/2013 | Nakano et al. | 257/66 |
| 8,610,131 B2 * | 12/2013 | Wada et al. | 257/77 |
| 2007/0057262 A1 | 3/2007 | Nakamura et al. | |
| 2007/0187695 A1 * | 8/2007 | Nakamura et al. | 257/77 |
| 2008/0124870 A1 * | 5/2008 | Park | 438/270 |
| 2008/0182376 A1 * | 7/2008 | Pattanayak et al. | 438/270 |
| 2008/0230787 A1 | 9/2008 | Suzuki et al. | |
| 2009/0008709 A1 * | 1/2009 | Yedinak et al. | 257/331 |
| 2010/0163988 A1 * | 7/2010 | Chow et al. | 257/342 |
| 2011/0204381 A1 * | 8/2011 | Okada et al. | 257/76 |
| 2011/0291110 A1 * | 12/2011 | Suzuki et al. | 257/77 |
| 2012/0080748 A1 * | 4/2012 | Hsieh | 257/331 |
| 2012/0313112 A1 * | 12/2012 | Wada et al. | 257/77 |
| 2013/0023113 A1 * | 1/2013 | Masuda et al. | 438/542 |
| 2013/0119407 A1 * | 5/2013 | Masuda et al. | 257/77 |

FOREIGN PATENT DOCUMENTS

| | | |
|---|---|---|
| JP | 9-199724 A | 7/1997 |
| JP | 10-247732 A | 9/1998 |
| JP | 2002-261275 A | 9/2002 |
| JP | 2007-080971 A | 3/2007 |
| JP | 2008-235546 A | 10/2008 |

* cited by examiner

SEMICONDUCTOR DEVICE HAVING ANGLED TRENCH WALLS

BACKGROUND OF THE INVENTION

1. Field of the Invention

The present invention relates to a semiconductor device and a method for manufacturing the semiconductor device, more particularly, a semiconductor device that suppresses decrease of channel mobility and occurrence of punch-through and that can be manufactured efficiently, as well as a method for manufacturing such a semiconductor device.

2. Description of the Background Art

In recent years, in order to achieve high breakdown voltage, low loss, and the like in a semiconductor device, silicon carbide has been adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

An exemplary semiconductor device employing silicon carbide as its material is a semiconductor device, such as a MOSFET (Metal Oxide Semiconductor Field Effect Transistor), which controls existence/non-existence of an inversion layer in an channel region in accordance with a predetermined threshold voltage so as to conduct and interrupt a current. For the MOSFET, in order to achieve further reduction of on-resistance, it has been considered to employ a trench type device structure characterized in that the channel region is formed along a wall surface of a trench, instead of a conventional planar type device structure, (for example, see Japanese Patent Laying-Open No. 7-326755, Japanese Patent Laying-Open No. 2008-235546, and Japanese Patent Laying-Open No. 8-70124), for example.

Here, in the conventional MOSFET, when a body region in which the inversion layer is to be formed is adapted to have a high impurity concentration, channel mobility is decreased. Hence, the impurity concentration of the body region needs to be not more than a certain value. However, when the body region is adapted to have a low impurity concentration, the thickness of the body region needs to be increased to suppress complete depletion (punch-through) in the body region. Hence, when the body region is formed by means of, for example, ion implantation, the number of times of performing ion implantation required is increased. This makes it difficult to efficiently manufacture the MOSFET. Thus, it is difficult to manufacture the conventional MOSFET efficiently while suppressing decrease of channel mobility and occurrence of punch-through, disadvantageously.

SUMMARY OF THE INVENTION

The present invention has been made to solve the foregoing problem, and has its object to provide a semiconductor device that suppresses decrease of channel mobility and occurrence of punch-through and that can be manufactured efficiently, as well as a method for manufacturing such a semiconductor device.

A semiconductor device according to the present invention includes: a substrate made of silicon carbide and provided with a trench that has a wall surface having an off angle of not less than 50° and not more than 65° relative to a {0001} plane and that has an opening at a side of one main surface thereof; an oxide film formed on and in contact with the wall surface of the trench; and an electrode disposed on and in contact with the oxide film. The substrate includes: a source region having first conductivity type and formed to include the one main surface and the wall surface; a body region having second conductivity type and formed to include the wall surface and make contact with the source region; and a drift region having the first conductivity type and formed to include the wall surface and make contact with the body region so as to sandwich the body region between the source region and the drift region. The source region and the body region are formed by means of ion implantation. The body region has a region that is sandwiched between the source region and the drift region and that has a thickness of 1 µm or smaller in a direction perpendicular to the one main surface. The body region has an impurity concentration of $3\times10^{17}$ cm$^{-3}$ or greater.

The present inventors have fully examined a scheme for efficiently manufacturing a semiconductor device while suppressing decrease of channel mobility and occurrence of punch-through. As a result, it has been found that when the trench wall surface near the region in which the channel region is formed is adapted to have an off angle falling within a predetermined range, specifically, not less than 50° and not more than 65° relative to the {0001} plane, the conflicting relation between increase of channel mobility and increase of the impurity concentration of the body region is drastically improved. Accordingly, the present inventors have arrived at the present invention. In the semiconductor device according to the present invention, the substrate is provided with the trench having the wall surface having an off angle of not less than 50° and not more than 65° relative to the {0001} plane. Hence, even when the impurity concentration of the body region is increased to reach or exceed $3\times10^{17}$ m$^{-3}$, channel mobility in the channel region along the wall surface is suppressed from being decreased. Further, by increasing the impurity concentration of the body region to the above-described range, the thickness of the region between the source region of the body region and the drift region, which is required to suppress occurrence of punch-through, is reduced to 1 µm or smaller in the direction perpendicular to the one main surface. Accordingly, the number of times of performing ion implantation required to form the body region is reduced, with the result that the semiconductor device can be efficiently manufactured. Thus, according to the semiconductor device in the present invention, there can be provided a semiconductor device that suppresses decrease of channel mobility and occurrence of punch-through and that can be manufactured efficiently.

In the semiconductor device, the body region may have an impurity concentration of $2\times10^{18}$ cm$^{-3}$ or smaller. In this way, while more securely suppressing decrease of channel mobility, the threshold voltage of the semiconductor device can be set in a practically appropriate range.

In the semiconductor device, the region of the body region between the source region and the drift region may have a thickness of 0.1 µm or greater in the direction perpendicular to the one main surface. In this way, the region including the channel region can be readily formed by means of ion implantation.

In the semiconductor device, a distance from the one main surface to a contact surface between the body region and the drift region may be 1.2 µm or smaller in the direction perpendicular to the one main surface.

When the thickness of the entire body region in the direction perpendicular to the one main surface is thus adapted to fall within the above-described range, the number of performing ion implantation required to form the body region is further reduced, thereby providing a semiconductor device that can be more efficiently manufactured.

In the semiconductor device, the wall surface of the trench may have an off orientation forming an angle of 5° or smaller relative to a <01-10> direction.

The <01-10> direction is a representative off orientation in a silicon carbide substrate. Hence, when the angle formed by the off orientation of the wall surface and the <01-10> direction is adapted to fall within the above-described range, the trench having the above-described wall surface can be readily formed.

In the semiconductor device, the wall surface of the trench may have an off angle of not less than −3° and not more than 5° relative to a {03-38} plane in the <01-10> direction.

In this way, decrease of channel mobility due to increase of the impurity concentration in the body region can be suppressed more effectively. Here, setting the off angle at not less than −3° and not more than +5° relative to the plane orientation of {03-38} is based on a fact that particularly high channel mobility was obtained in this set range as a result of inspecting a relation between the channel mobility and the off angle.

Further, the "off angle relative to the {03-38} plane in the <01-10> direction" refers to an angle formed by an orthogonal projection of a normal line of the wall surface to a flat plane including the <01-10> direction and the <0001> direction, and a normal line of the {03-38} plane. The sign of positive value corresponds to a case where the orthogonal projection approaches in parallel with the <01-10> direction whereas the sign of negative value corresponds to a case where the orthogonal projection approaches in parallel with the <0001> direction.

It should be noted that the wall surface more preferably has a plane orientation of substantially {03-38}, and the wall surface further preferably has a plane orientation of {03-38}. Here, the expression "the wall surface has a plane orientation of substantially {03-38}" is intended to mean that the plane orientation of the wall surface is included in a range of off angle such that the plane orientation can be substantially regarded as {03-38} in consideration of processing accuracy in the trench formation and the like. In this case, the range of off angle is, for example, a range of off angle of ±2° relative to {03-38}. In this way, decrease of channel mobility due to increase of the impurity concentration in the body region can be suppressed more effectively.

In the semiconductor device, the wall surface of the trench may have an off orientation forming an angle of 5° or smaller relative to a <−2110> direction.

The <−2110> direction is a representative off orientation in a silicon carbide substrate, as with the <01-10> direction. Hence, when the angle formed by the off orientation of the wall surface and the <−2110> direction is adapted to fall within the above-described range, the trench having the wall surface can be readily formed.

In the semiconductor device, the wall surface of the trench may correspond to a plane at a carbon plane side of silicon carbide constituting the substrate.

In this way, decrease of channel mobility due to increase of the impurity concentration in the body region can be suppressed more effectively. Here, the (0001) plane of single-crystal silicon carbide of hexagonal crystal is defined as the silicon plane whereas the (000-1) plane is defined as the carbon plane. In other words, when employing the configuration in which the off orientation of the wall surface forms an angle of 5° or smaller relative to the <01-10> direction, decrease of channel mobility can be more effectively suppressed by adapting the wall surface to correspond to a plane close to the (0-33-8) plane.

A method for manufacturing a semiconductor device in the present invention includes the steps of: preparing a substrate made of silicon carbide; forming a trench in the substrate, the trench having an opening at a side of one main surface of the substrate and having a wall surface having an off angle of not less than 50° and not more than 65° relative to a {0001} plane; forming an oxide film on and in contact with the wall surface; and forming an electrode on and in contact with the oxide film. The step of preparing the substrate includes the steps of: forming a drift region having first conductivity type; and forming a source region and a body region in contact with each other, the source region having the first conductivity type and including the one main surface, the body region having second conductivity type. In the step of forming the trench, the trench is formed to extend through the source region and the body region to reach the drift region. In the step of forming the source region and the body region, the source region and the body region are formed by means of ion implantation such that a region thereof between the source region and the drift region has a thickness of 1 μm or smaller in a direction perpendicular to the one main surface and such that the body region has an impurity concentration of $3 \times 10^{17}$ cm$^{-3}$ or greater.

According to the method for manufacturing the semiconductor device in the present invention, the semiconductor device according to the present invention can be efficiently manufactured while suppressing decrease of channel mobility and occurrence of punch-through.

In the method for manufacturing the semiconductor device, in the step of forming the source region and the body region, the body region may be formed to have an impurity concentration of $2 \times 10^{18}$ cm$^{-3}$ or smaller. In this way, while suppressing decrease of channel mobility, the threshold voltage of the semiconductor device can be set in a practically appropriate range.

In the method for manufacturing the semiconductor device, in the step of forming the source region and the body region, the source region and the body region may be formed such that the region between the source region and the drift region has a thickness of 0.1 μm or greater in the direction perpendicular to the one main surface. In this way, the region including the channel region can be readily formed by means of ion implantation.

In the method for manufacturing the semiconductor device, in the step of forming the source region and the body region, the body region may be formed such that a distance from the one main surface to a contact surface between the body region and the drift region becomes 1.2 μm or smaller in the direction perpendicular to the one main surface.

Accordingly, the number of times of performing ion implantation required to form the body region is further reduced, with the result that the semiconductor device can be more efficiently manufactured.

In the method for manufacturing the semiconductor device, in the step of forming the trench, the substrate may be provided with the trench having the wall surface having an off orientation forming an angle of 5° or smaller relative to a <01-10> direction.

Thus, when the angle formed by the <01-10> direction, which is a representative off orientation in the silicon carbide substrate, and the off orientation of the wall surface is adapted to fall within the above-described range, the trench including the above-described wall surface can be readily formed in the substrate.

In the method for manufacturing the semiconductor device, in the step of forming the trench, the substrate may be provided with the trench having the wall surface having an off angle of not less than −3° and not more than 5° relative to a {03-38} plane in the <01-10> direction.

Thus, when the off angle of the wall surface of the trench relative to the {03-38} plane in the <01-10> direction is adapted to fall within the above-described range, the channel mobility can be more effectively suppressed from being decreased due to increase of the impurity concentration in the body region.

In the method for manufacturing the semiconductor device, in the step of forming the trench, the substrate may be provided with a trench having the wall surface having an off orientation forming an angle of 5° or smaller relative to a <-2110> direction.

Thus, when the angle formed by the <-2110> direction, which is a representative off orientation in the silicon carbide substrate, and the off orientation of the wall surface is adapted to fall within the above-described range, the trench including the above-described wall surface can be readily formed in the substrate.

In the method for manufacturing the semiconductor device, in the step of forming the trench, the substrate may be provided with the trench having the wall surface corresponding to a plane at a carbon plane side of silicon carbide constituting the substrate.

When the wall surface of the trench is thus adapted to correspond to the plane at the carbon plane side of silicon carbide, the channel mobility can be more effectively suppressed from being decreased due to increase of the impurity concentration in the body region.

As apparent from the description above, according to the semiconductor device and the method for manufacturing the semiconductor device in the present invention, a semiconductor device can be efficiently manufactured while suppressing decrease of channel mobility and occurrence of punch-through.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
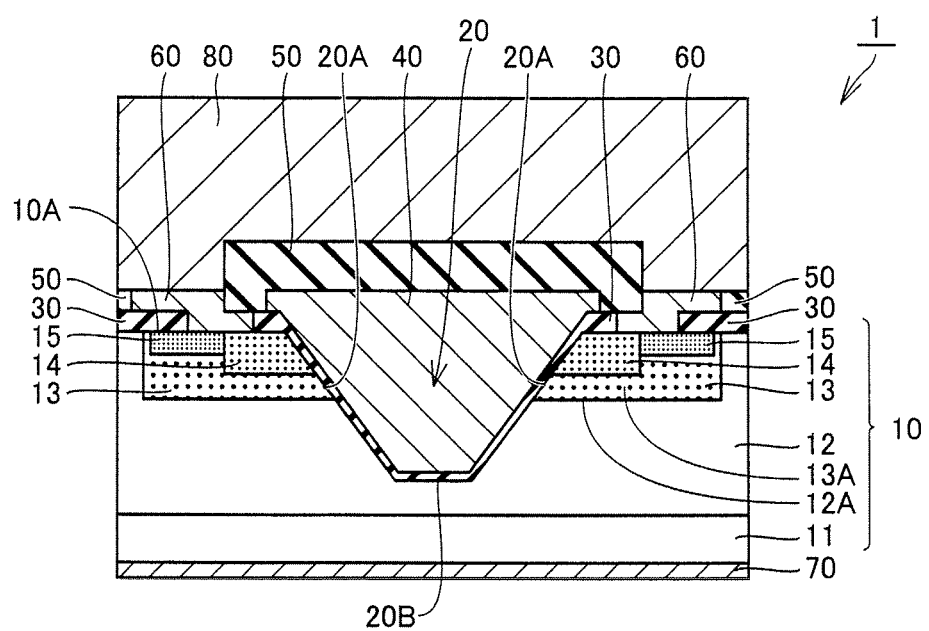
FIG. 1 is a schematic cross sectional view showing a structure of a MOSFET.

The following describes an embodiment of the present invention with reference to figures. It should be noted that in the below-mentioned figures, the same or corresponding portions are given the same reference characters and are not described repeatedly. Further, in the present specification, an individual orientation is represented by [ ], a group orientation is represented by < >, and an individual plane is represented by ( ), and a group plane is represented by 0. In addition, a negative index is supposed to be crystallographically indicated by putting "-" (bar) above a numeral, but is indicated by putting the negative sign before the numeral in the present specification.

First, the following describes a structure of a semiconductor device according to one embodiment of the present invention. Referring to FIG. 1, a MOSFET 1 serving as the semiconductor device according to the present embodiment has a substrate 10, oxide films 30, a gate electrode 40, interlayer insulating films 50, source electrodes 60, a drain electrode 70, and a source wire 80. Substrate 10 has a main surface 10A having an off angle of 8° or smaller relative to a {0001} plane, and is made of silicon carbide. Substrate 10 includes a silicon carbide substrate 11, a drift region 12, body regions 13, source regions 14, and contact regions 15.

Substrate 10 is provided with a trench 20 having side wall surfaces 20A and a bottom surface 20B, and having an opening at the main surface 10A side. Trench 20 is formed to extend through source region 14 and body region 13 and have bottom surface 20B located in drift region 12. Further, each of side wall surfaces 20A has an off angle of not less than 50° and not more than 65° relative to the {0001} plane. Also, each of trench wall surfaces, which are exposed and adjacent to and in contact with body regions 13 and source regions 14, has an off angle of not less than 50° and not more than 65° relative to the {0001} plane.

Silicon carbide substrate 11 contains an n type impurity such as N (nitrogen) and therefore has n type conductivity. Drift region 12 includes side wall surfaces 20A and bottom surface 20B of trench 20, and is formed on one main surface of silicon carbide substrate 11. Drift region 12 contains an n type impurity such as P (phosphorus) and therefore has n type conductivity. The concentration of the n type impurity is lower than that in silicon carbide substrate 11.

Body regions 13 include side wall surfaces 20A and are formed opposite to silicon carbide substrate 11 relative to drift region 12. Each of body regions 13, which are formed by means of ion implantation, contains a p type impurity such as Al (aluminum) or B (boron) and therefore has p type conductivity. Further, the concentration of the p type impurity contained in body region 13 is $3 \times 10^{17}$ cm$^{-3}$ or greater.

Source regions 14 include main surface 10A of substrate 10 and side wall surfaces 20A of trench 20, and are formed in contact with body regions 13 and contact regions 15. Each of source regions 14, which are formed by means of ion implantation, contains an n type impurity such as P (phosphorus) and therefore has n type conductivity. Further, the concentration of the n type impurity contained in source region 14 is higher than that in drift region 12.

Contact regions 15 include main surface 10A and are formed in contact with body regions 13 and source regions 14. Each of contact regions 15 contains a p type impurity such as Al (aluminum) or B (boron), and therefore has p type conductivity. Further, the concentration of the p type impurity contained in contact region 15 is higher than that in body region 13.

Thus, substrate 10 includes: source regions 14 formed to include main surface 10A and side wall surfaces 20A; body regions 13 formed to include side wall surface 20A and make contact with source regions 14; and drift region 12 formed to include side wall surfaces 20A and make contact with body regions 13 so as to sandwich body regions 13 between drift region 12 and source regions 14. Further, each of body regions 13 has an internal region 13A, which is a region between each source region 14 and drift region 12 and has a thickness of 1 μm or smaller in a direction perpendicular to main surface 10A. Internal region 13A has a p type impurity concentration of $3\times10^{17}$ cm$^{-3}$ or greater, as with regions of body region 13 other than internal region 13A.

Oxide films 30 are formed in contact with side wall surfaces 20A, bottom surface 20B, and main surface 10A. More specifically, oxide films 30 are made of, for example, silicon dioxide ($SiO_2$), and are formed to cover side wall surfaces 20A, bottom surface 20B, and portions of main surface 10A.

Gate electrode 40 is formed on and in contact with oxide film 30. More specifically, gate electrode 40 is made of a conductor such as polysilicon having an impurity added therein, or Al, and is formed to fill the inside of trench 20.

Interlayer insulating films 50 are formed to surround gate electrode 40 together with oxide films 30, so as to electrically insulate gate electrode 40 from source electrodes 60 and source wire 80. Each of interlayer insulating films 50 is made of, for example, silicon dioxide ($SiO_2$).

Each of source electrodes 60 is formed in contact with source region 14 and contact region 15. Source electrode 60 is made of a material capable of ohmic contact with source region 14, such as $Ni_xSi_y$ (nickel silicide), $Ti_xSi_y$ (titanium silicide), $Al_xSi_y$ (aluminum silicide), or $Ti_xAl_ySi_z$ (titanium aluminum silicide). Source electrode 60 is electrically connected to source region 14.

Drain electrode 70 is formed opposite to drift region 12 relative to silicon carbide substrate 11. Drain electrode 70 is made of a material capable of ohmic contact with silicon carbide substrate 11, such as the same material as that of source electrode 60. Drain electrode 70 is electrically connected to silicon carbide substrate 11.

Source wire 80 is formed in contact with source electrode 60. Source wire 80 is made of, for example, a conductor such as Al, and is electrically connected to source region 14 via source electrode 60.

The following describes operations of MOSFET 1. Referring to FIG. 1, when a voltage is applied between source electrode 60 and drain electrode 70 while gate electrode 40 is fed with a voltage smaller than a threshold voltage, i.e., while it is in the OFF state, a pn junction formed between body region 13 and drift region 12 is reverse-biased. Accordingly, MOSFET 1 is in the non-conductive state. On the other hand, when a voltage equal to or greater than the threshold voltage is applied to gate electrode 40, carriers are accumulated along each of side wall surfaces 20A in internal regions 13A, thereby forming an inversion layer. As a result, source region 14 and drift region 12 are electrically connected to each other, whereby a current flows between source electrode 60 and drain electrode 70. In this way, MOSFET 1 is operated.

As described above, in MOSFET 1 serving as the semiconductor device according to the present embodiment, each of side wall surfaces 20A has an off angle falling within a range of not less than 50° and not more than 65° relative to the {0001} plane. Hence, even when the impurity concentration of body region 13 is increased to reach or exceed $3\times10^{17}$ cm$^{-3}$, channel mobility can be suppressed from being decreased. Further, by increasing the impurity concentration of body region 13 to the above-described range, the thickness of internal region 13A required to suppress occurrence of punch-through is reduced to 1 μm or smaller in the direction perpendicular to main surface 10A. Accordingly, the number of times of performing ion implantation required to form body region 13 is reduced, with the result that MOSFET 1 can be efficiently manufactured. Thus, according to MOSFET 1 serving as the semiconductor device in the present embodiment, there can be provided a semiconductor device that suppresses decrease of channel mobility and occurrence of punch-through and that can be manufactured efficiently.

Further, in MOSFET 1, body region 13 may have an impurity concentration of $2\times10^{18}$ cm$^{-3}$ or smaller. In this way, while more securely suppressing decrease of channel mobility, the threshold voltage of the semiconductor device can be set in a practically appropriate range.

Further, in MOSFET 1, the thickness of internal region 13A in the direction perpendicular to main surface 10A may be 0.1 μm or greater. In this way, internal region 13A including the channel region can be readily formed by means of ion implantation.

Further, in MOSFET 1, a distance from main surface 10A to a contact surface 12A between body region 13 and drift region 12 may be 1.2 μm or smaller in the direction perpendicular to main surface 10A. When the thickness of entire body region 13 in the direction perpendicular to main surface 10A is thus adapted to fall within the above-described range, the number of performing ion implantation required to form body region 13 is further reduced, thereby providing a semiconductor device that can be more efficiently manufactured.

Further, in MOSFET 1, at least one of side wall surfaces 20A may have an off orientation forming an angle of 5° or smaller relative to a <01-10> direction. Further, at least one of side wall surfaces 20A may have an off orientation forming an angle of 5° or smaller relative to a <-2110> direction. Thus, when the angle formed by the off orientation of at least one of side wall surfaces 20A and the representative off orientation in the silicon carbide substrate, i.e., each of the <01-10> direction and the <-2110> direction is adapted to fall within the above-described range, trench 20 including side wall surfaces 20A can be readily formed.

Further, in MOSFET 1, at least one of side wall surfaces 20A may have an off angle of not less than -3° and not more than 5° relative to a {03-38} plane in the <01-10> direction. Further, at least one of side wall surfaces 20A may be a plane at the carbon plane side of silicon carbide constituting substrate 10. In this way, channel mobility can be more efficiently suppressed from being decreased due to increase of the impurity concentration of body region 13.

The following describes a method for manufacturing a semiconductor device according to one embodiment of the present invention, with reference to FIG. 1 to FIG. 9. In the method for manufacturing the semiconductor device according to the present embodiment, MOSFET 1 serving as the semiconductor device according to the present embodiment is manufactured.

Figure 2:
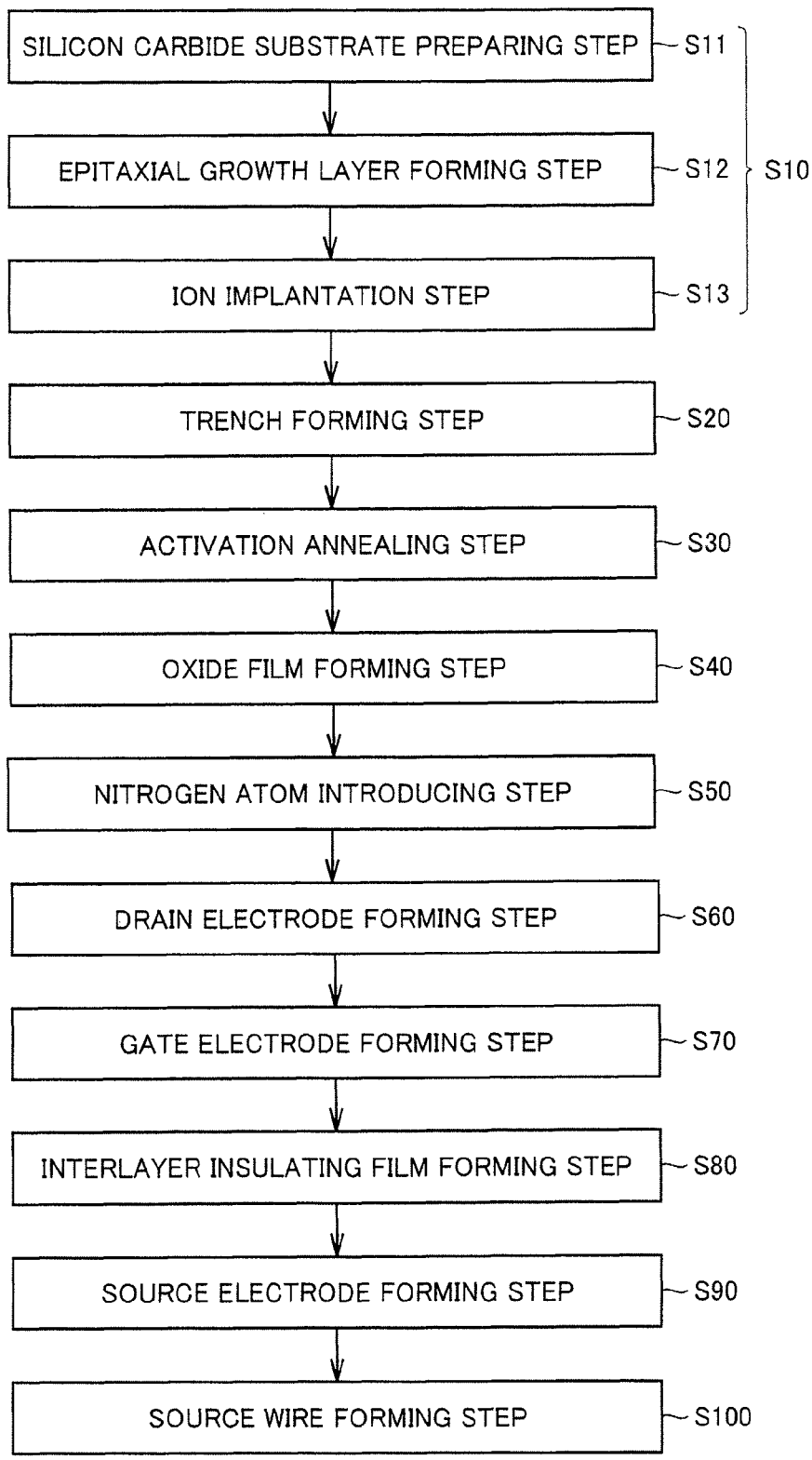
FIG. 2 is a flowchart schematically showing a method for manufacturing the MOSFET.
Figure 3:
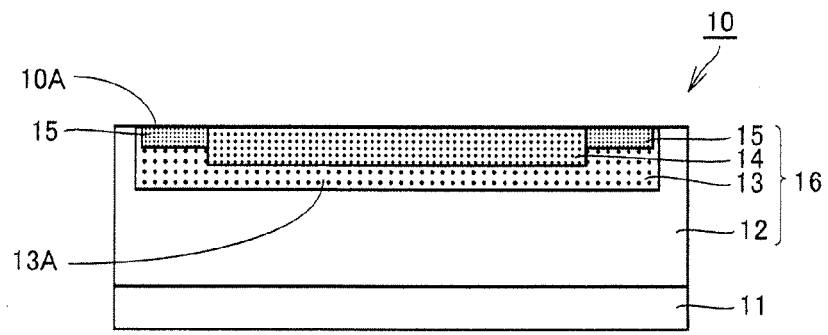
FIG. 3 is a schematic cross sectional view for illustrating the method for manufacturing the MOSFET.
Figure 4:
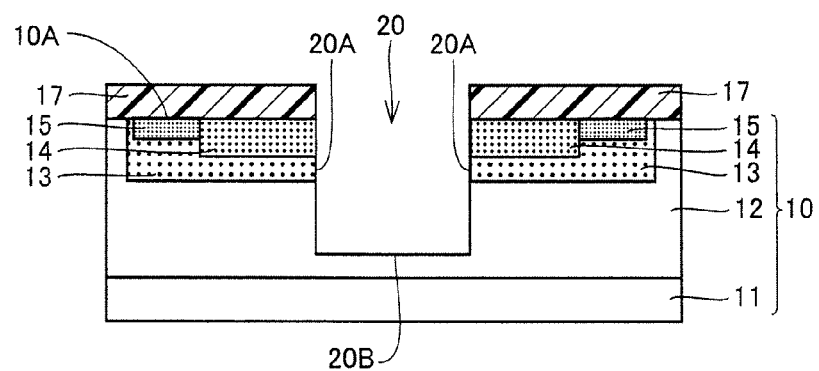
FIG. 4 is a schematic cross sectional view for illustrating the method for manufacturing the MOSFET.
Figure 5:
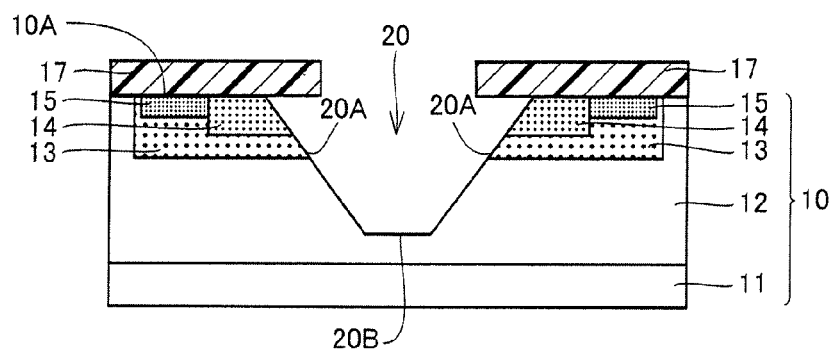
FIG. 5 is a schematic cross sectional view for illustrating the method for manufacturing the MOSFET.
Figure 6:
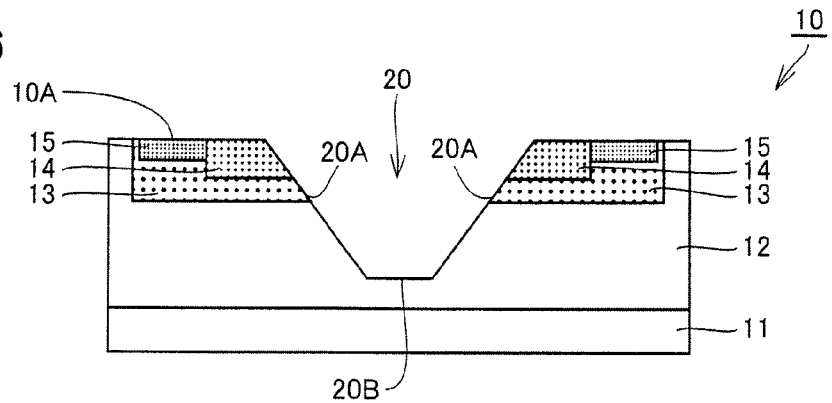
FIG. 6 is a schematic cross sectional view for illustrating the method for manufacturing the MOSFET.
Figure 7:
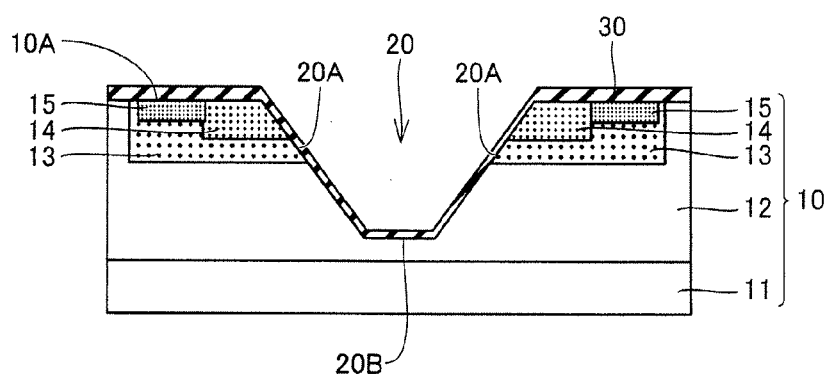
FIG. 7 is a schematic cross sectional view for illustrating the method for manufacturing the MOSFET.
Figure 8:
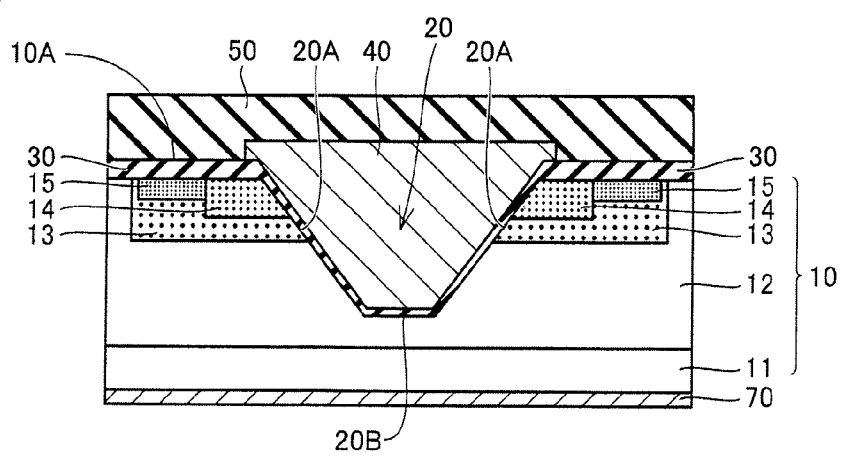
FIG. 8 is a schematic cross sectional view for illustrating the method for manufacturing the MOSFET.
Figure 9:
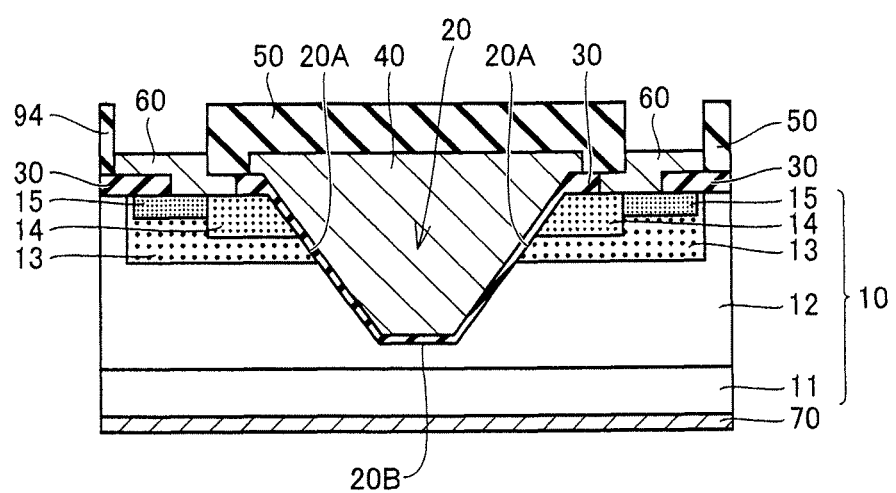
FIG. 9 is a schematic cross sectional view for illustrating the method for manufacturing the MOSFET.

Referring to FIG. 2, first, a substrate preparing step is performed as a step (S10). In this step (S10), below-described steps (S11) to (S13) are performed to prepare substrate 10 made of silicon carbide. First, as step (S11), a silicon carbide substrate preparing step is performed. In this step (S11), referring to FIG. 3, an ingot made of, for example, 4H-SiC is sliced to prepare silicon carbide substrate 11.

Next, as step (S12), an epitaxial growth layer forming step is performed. In this step (S12), by means of epitaxial growth, a silicon carbide layer 16 having n type conductivity is formed on one main surface of silicon carbide substrate 11. Further, in silicon carbide layer 16, a region not to have ions implanted therein in the subsequent step (S13) serves as drift region 12, thus forming drift region 12.

Next, as step (S13), an ion implantation step is performed. In this step (S13), first, for example, Al ions are implanted into a region including main surface 10A to form body region 13 having p type conductivity. Next, for example, P ions are implanted into the region including main surface 10A to an shallower implantation depth than the implantation depth for the Al ions, thereby forming source region 14 having n type conductivity. Then, for example, Al ions are further implanted into the region including main surface 10A to a shallower implantation depth than the implantation depth for the P ions, thereby forming contact regions 15 having p type conductivity.

Thus, step (S10) includes the steps of: forming drift region 12 having n type conductivity; and forming source region 14 and body region 13 in contact with each other, source region 14 including main surface 10A and having n type conductivity, body region 13 having p type conductivity. Further, in the step of forming the source region and the body region, source region 14 and body region 13 are formed by means of ion implantation. Further, a region sandwiched between source region 14 and body region 13 in the direction perpendicular to main surface 10A serves as internal region 13A including the channel region.

Further, in step (S13), body region 13 is formed to have an impurity concentration of not less than $3 \times 10^{17}$ cm$^{-3}$ and not more than $2 \times 10^{18}$ cm$^{-3}$. More specifically, in the formation of body region 13, the Al ions are implanted using, for example, a beam current of not less than 10 µA and not more than 2000 µA. In this way, the threshold voltage of MOSFET 1 can be set in a practically appropriate range while suppressing decrease of channel mobility and occurrence of punch-through.

Further, in step (S13), body region 13 is preferably formed such that a distance from main surface 10A to contact surface 12A between drift region 12 and body region 13, i.e., the entire thickness of body region 13 in the direction perpendicular to main surface 10A is 1.2 µm or smaller. More specifically, in the formation of body region 13, the Al ions are implanted with an implantation energy of, for example, not less than 10 keV and not more than 800 keV. In this way, the number of performing ion implantation required to form body region 13 is reduced, whereby MOSFET 1 can be manufactured more efficiently.

Further, in step (S13), source region 14 and body region 13 are formed such that the thickness of internal region 13A, i.e., the region sandwiched between source region 14 and drift region 12 in the direction perpendicular to main surface 10A, becomes not less than 0.1 µm and not more than 1 µm. In this way, internal region 13A including the channel region can be readily formed by means of ion implantation.

Next, as a step (S20), a trench forming step is performed. In this step (S20), referring to FIG. 4, substrate 10 is provided with trench 20 including side wall surfaces 20A and bottom surface 20B and having an opening at the main surface 10A side. More specifically, first, a mask layer 17 formed of, for example, a resist is formed on a region of main surface 10A other than its region in which trench 20 is to be formed. Next, for example, dry etching such as RIE (Reactive Ion Etching) is employed to form trench 20 extending through source region 14 and body region 13 and having bottom surface 20B located in drift region 12. Next, referring to FIG. 5, for example, thermal etching is performed using a halogen-based gas such as chlorine gas, whereby each of side wall surfaces 20A has an off angle of not less than 50° and not more than 65° relative to the {0001} plane. Further, in step (S20), each of the trench wall surfaces exposed and adjacent to and in contact with body region 13 and source region 14 may have an off angle of not less than 50° and not more than 65° relative to the {0001} plane. Then, referring to FIG. 6, after completing the formation of trench 20, mask layer 17 is removed.

Further, in step (S20), trench 20 may be formed such that at least one of side wall surfaces 20A has an off orientation forming an angle of 5° or smaller relative to the <01-10> direction. Further, trench 20 may be formed such that at least one of side wall surfaces 20A has an off orientation forming an angle of 5° or smaller relative to the <-2110> direction. Thus, when the angle formed by the representative off orientation in the silicon carbide substrate and the off orientation of at least one of side wall surfaces 20A are adapted to fall within the above-described range, trench 20 including side wall surfaces 20A can be readily formed in substrate 10.

Further, in step (S20), trench 20 may be formed such that at least one of side wall surfaces 20A has an off angle of not less than −3° and not more than 5° relative to the {03-38} in the <01-10> direction. Further, trench 20 may be formed such that at least one of side wall surfaces 20A corresponds to a plane at the carbon plane side of silicon carbide constituting substrate 10. In this way, decrease of channel mobility due to increase of the impurity concentration in body region 13 can be suppressed more effectively.

In the method for manufacturing the semiconductor device according to the present embodiment, in step (S20), substrate 10 is subjected to the dry etching such as RIE and is then subjected to the thermal etching, thereby forming trench 20 having side wall surfaces 20A each having an off angle of not less than 50° and not more than 65° relative to the {0001} plane. However, the present invention is not limited to this. For example, in order to form trench 20 having side wall surfaces 20A having an off angle of not less than 50° and not more than 65° relative to the {0001} plane, RIE having high anisotropy in etching rate may be employed without performing the thermal etching.

Next, as a step (S30), an activation annealing step is performed. In this step (S30), substrate 10 is heated to activate the impurities introduced in step (S10) described above.

Next, as a step (S40), an oxide film forming step is performed. In this step (S40), referring to FIG. 7, for example, substrate 10 is heated in an atmosphere including oxygen, thereby forming oxide film 30 to cover side wall surfaces 20A, bottom surface 20B, and main surface 10A. Next, as a step (S50), a nitrogen atom introducing step is performed. In this step (S50), in an atmosphere including a gas containing nitrogen atoms, substrate 10 is heated to introduce the nitrogen atoms in a region including an interface between oxide film 30 and silicon carbide constituting substrate 10. This step (S50) is not an essential step, but by performing this step, interface states can be reduced in the region including the interface between oxide film 30 and silicon carbide constituting substrate 10. Accordingly, channel mobility can be suppressed from being decreased due to the existence of the interface states. Examples of the gas containing the nitrogen atoms may include NO (carbon monoxide), NO$_2$ (nitrogen dioxide), N$_2$O (nitrous oxide), and the like. Further, in this step (S50), after heating substrate 10 in an atmosphere including the gas containing the nitrogen atoms as described above, substrate 10 may be further heated in an argon atmosphere, for example.

Next, as a step (S60), a drain electrode forming step is performed. In this step (S60), referring to FIG. 8, a film made of, for example, Ni is formed on one main surface of silicon carbide substrate 11 opposite to the side on which drift region 12 is formed. Thereafter, heat treatment for alloying is performed, thereby siliciding at least a portion of the film made of Ni. In this way, drain electrode 70 is formed.

Next, as a step (S70), a gate electrode forming step is performed. In this step (S70), for example, an LPCVD (Low Pressure Chemical Vapor Deposition) method is employed to form a polysilicon film having an impurity added therein so as to fill the inside of trench 20. In this way, gate electrode 40 is formed on and in contact with oxide film 30.

Next, as a step (S80), an interlayer insulating film forming step is performed. In this step (S80), interlayer insulating film 50 made of $SiO_2$, which is an insulator, is formed by means of a P (Plasma)-CVD method to cover gate electrode 40 and oxide film 30, for example.

Next, as a step (S90), a source electrode forming step is performed. In this step (S90), referring to FIG. 9, first, interlayer insulating film 50 and oxide film 30 are removed from regions in which source electrodes 60 are to be formed, thereby forming regions in which source regions 14 and contact regions 15 are exposed. Then, as with drain electrode 70, a film made of, for example, Ni is formed in the regions, and at least a portion of the film is silicided, thereby forming source electrodes 60.

Next, as a step (S100), a source wire forming step is performed. In this step (S100), referring to FIG. 1, source wire 80 made of a conductor such as Al is formed on and in contact with source electrode 60 by means of, for example, a deposition method. By performing steps (S10) to (S100), MOSFET 1 is manufactured, thus completing the method for manufacturing the semiconductor device according to the present embodiment. As described above, according to the method for manufacturing the semiconductor device in the present embodiment, MOSFET 1 can be efficiently manufactured while suppressing decrease of channel mobility and occurrence of punch-through.

The semiconductor device and the method for manufacturing the semiconductor device in the present invention can be advantageously applied particularly to a semiconductor device required to be manufactured efficiently while suppressing decrease of channel mobility and occurrence of punch-through, as well as a method for manufacturing such a semiconductor device.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a substrate made of silicon carbide and provided with a trench that has a wall surface having an off angle of not less than 50° and not more than 65° relative to a {0001} plane and that has an opening at a side of one main surface thereof;
   an oxide film formed on and in contact with said wall surface of said trench; and
   an electrode disposed on and in contact with said oxide film,
   said substrate including
      a source region having first conductivity type and formed to include said one main surface and said wall surface,
      a body region having second conductivity type and formed to include said wall surface and make contact with said source region, and
      a drift region having the first conductivity type and formed to include said wall surface and make contact with said body region so as to sandwich said body region between said source region and said drift region,
   said source region and said body region being formed by means of ion implantation,
   said body region having a region that is sandwiched between said source region and said drift region and that has a thickness of 1 μm or smaller in a direction perpendicular to said one main surface,
   said body region having an impurity concentration of $3 \times 10^{17}$ $cm^{-3}$ or greater.

2. The semiconductor device according to claim 1, wherein said body region has an impurity concentration of $2 \times 10^{18}$ $cm^{-3}$ or smaller.

3. The semiconductor device according to claim 1, wherein the region of said body region between said source region and said drift region has a thickness of 0.1 μm or greater in the direction perpendicular to said one main surface.

4. The semiconductor device according to claim 1, wherein a distance from said one main surface to a contact surface between said body region and said drift region is 1.2 μm or smaller in the direction perpendicular to said one main surface.

5. The semiconductor device according to claim 1, wherein said wall surface has an off orientation forming an angle of 5° or smaller relative to a <01-10> direction.

6. The semiconductor device according to claim 5, wherein said wall surface has an off angle of not less than −3° and not more than 5° relative to a {03-38} plane in the <01-10> direction.

7. The semiconductor device according to claim 1, wherein said wall surface has an off orientation forming an angle of 5° or smaller relative to a <−2110> direction.

8. The semiconductor device according to claim 1, wherein said wall surface corresponds to a plane at a carbon plane side of silicon carbide constituting said substrate.

* * * * *